United States Patent [19]

Watanabe et al.

[11] Patent Number: 4,942,327

[45] Date of Patent: Jul. 17, 1990

[54] SOLID STATE ELECTRONIC DEVICE

[75] Inventors: Hitoshi Watanabe; Norio Hosaka, both of Yokohama; Akitsuna Yuhara, Kawasaki; Jun Yamada, Yokohama, all of Japan

[73] Assignee: Hitachi, Ltd., Tokyo, Japan

[21] Appl. No.: 357,464

[22] Filed: May 26, 1989

[30] Foreign Application Priority Data

Jun. 1, 1988 [JP] Japan ................................ 63-132686

[51] Int. Cl.$^5$ ............................................. H01L 41/08
[52] U.S. Cl. ............................ 310/313 R; 310/313 B; 310/363; 310/364; 310/313 A
[58] Field of Search ........... 310/313 R, 313 A, 313 B, 310/363, 364

[56] References Cited

U.S. PATENT DOCUMENTS 4,489,250 12/1984 Ebata et al. ...................... 310/313 A
4,775,814 10/1988 Yuhara et al. ................... 310/364 X

FOREIGN PATENT DOCUMENTS 45-1133 1/1970 Japan .
49-22397 2/1974 Japan .

OTHER PUBLICATIONS

Transactions of the Institute of Electronics & Communications Engineers of Japan, vol. J67 C, No. 3, (Mar. 1984), pp. 278-285.
IEEE Transactions on Parts, Hybrids and Packaging, vol. PHP-7, No. 3, pp. 134-138.

Primary Examiner—Mark O. Budd
Attorney, Agent, or Firm—Antonelli, Terry, Stout & Kraus

[57] ABSTRACT

A solid state electronic device having a thin film of an Al (aluminum) alloy Li (lithium) on the surface of a substrate for a surface acoustic wave (SAW). Interdigital electrodes, electric wiring patterns and bonding pads are formed by the thin film of the Li-added Al alloy. This thin film suppresses migration which occurs when a high density current is supplied to the device or a large amplitude SAW is generated. The thin film, which provides a small loss and relatively low hardness, provides a desired power handling capability and high yield of wire bonding. The this film assures high endurance to failure of the device and sufficient life of the device.

8 Claims, 9 Drawing Sheets

SOLID STATE ELECTRONIC DEVICE

BACKGROUND OF THE INVENTION

The present invention relates to a solid state electronic device for transferring a surface acoustic wave (hereinafter referred to as SAW) having a larger electric power or a solid state electronic device in which a large amplitude SAW exists as a standing wave, and more particularly to a thin film electrode, electric wiring pattern or bonding pad which can be suitably employed in such a solid state electronic device.

In the case where a current of high density as high as $10^5$-$10^6$ A/cm$^2$ or more flows through an aluminum (Al) and Al electric wiring pattern of the conventional semiconductor device having an integrated circuit, a phenomenon of migration will occur in the electrode or electric wiring pattern. The migration causes hillocks, voids, etc., which frequently leads to short-circuiting or disconnection of the electrode and electric wiring pattern. The cause thereof is considered to be that Al atoms move at crystal boundaries due to collision of electrons.

Techniques of obviating the migration have been proposed in JP-B-No. 45-1133 (published on Jan. 14, 1970), JP-A-No. 49-22397 (laid-open on Feb. 27, 1974), etc. These conventional techniques use an electrode of an Al alloy in which copper is added to Al.

On the other hand, as disclosed in an article in the Transactions of the Institute of Electronics and Communication Engineers of Japan, Vol. J67C, No. 3, pages 278-285 (March 1984), the same defect as that due to the above migration occurs in an electrode of the solid state electronic device such as a SAW filter for transferring a large electric power, a SAW resonator in which a large amplitude SAW exists as a standing wave. Specifically, in the SAW filter, troubles due to the short-circuiting or disconnection of wirings frequently occurs. Also in the SAW resonator, a remarkable secular change in a resonant frequency disadvantageously occurs.

This article explains the mechanism of producing defects in the SAW device as follows. Distortion in a substrate surface generated by SAW gives rise to an internal stress in an Al electrode (thin film) formed on the substrate surface. The grain boundary in the Al crystal moves at the area where the internal stress exceeds a threshold value and there voids and hillocks are generated. The movement of the grain boundary due to the internal stress is considered to occur through the same mechanism as in the temperature cycle in an integrated circuit which is described in an article in IEEE Transactions on Parts, Hybrids and Packaging, Vol. PHP-7, No. 3, pp. 134-138.

Incidentally, the above JP-B and JP-A propose, as means for obviating the defect of the Al electrode due to the migration, to dope a minute amount (1-4 wt %) of Cu, which has been adopted in a semiconductor integrated circuit.

However, the above conventional technique could not provide desired performances in relation to power handling capability, device loss, mass-productivity, etc. For example, the SAW device for use in a high frequency as high as 800 MHz or so could not assure a life enough to operate using a large electric power, and also provided reduced production yield of wire bondings due to increased hardness of the thin film (electrode).

In co-pending U.S. application (A. Yuhara et al) Ser. No. 263,078 (based on Japanese Patent Application Nos. 61-3428 and 61-46138) filed Oct. 27, 1988 and assigned to the assignee of the present invention which is a continuation of application Ser. No. 2,286 filed Jan. 12, 1987, now abandoned, a SAW device is disclosed in which electrodes are formed on a piezoelectric substrate by sputtering and/or the electrodes contain an additive of Cu, Ti, Zn, Mg, Fe, Ni, Cr, Ga, Ge, Sn, Pd or Ta. The above-mentioned Japanese applications were published as JP-A-No. 62-163408 on July 20, 1987 and as JP-A-No. 62-204611 on Sept. 9, 1987.

SUMMARY OF THE INVENTION

An object of the present invention is to provide a solid state electronic device for SAW having an electrode (electric wiring pattern and bonding pad) which can sufficiently satisfy the conditions of power handling capability, device loss and mass-productivity.

In order to attain this object, in accordance with the present invention, at least one of an electrode, electric wiring pattern and bonding pad, or at least a part thereof is made of a thin film of an Al alloy containing Li (lithium) in an amount of 0.05-3 wt %.

The thin film of the Al alloy containing Li has a smaller resistivity than an Al alloy containing Cu when compared in terms of an addition content amount. Thus, if this Li-added Al alloy thin film is applied to the SAW filter or SAW resonator, its device loss can be decreased.

Further, if an electrode for transmission/reception is made of a thin film of an Al alloy containing Li through the D.C. magnetron sputtering which can provide a stabilized composition of the film, the SAW device for a high frequency can provide an excellent power handling capability. One reason thereof is that in the Al alloy thin film containing Li, Al atoms are restrained in their self-diffusion and become less mobile responsive to the stress. Another reason thereof is that static stress of the thin film is small and so the entire stress of the thin film including high frequency dynamic stress due to SAW is reduced.

Moreover, the Li-doped Al-alloy thin film, in which the self-diffusion of Al atoms is restrained, also provides an increased resistance against the migration due to current. Thus, if it is applied to the electrode, etc. to which a large electric power is supplied, the solid state electronic device provides an excellent power resistance characteristic. Further, the Li-added Al-alloy thin film provides a greater effect of suppressing electrode deterioration than the Al alloy added with the other dopant such as Cu so that a small addition amount of Li provides the desired performance of the device.

Accordingly, first, the resistivity is smaller than in the Cu-added Al alloy so that heat amount generated when a high frequency electric power is supplied is reduced and so advance of the electrode failure due to temperature increase is prevented thus improving the power resistance characteristic of the solid state electronic device. Secondly, a small addition amount of Li suffice so that the hardness of the thin film is smaller than the Cu-added thin film. Thus, the production yield in wire bonding is improved.

DESCRIPTION OF THE PREFERRED EMBODIMENTS

Figure 1A:
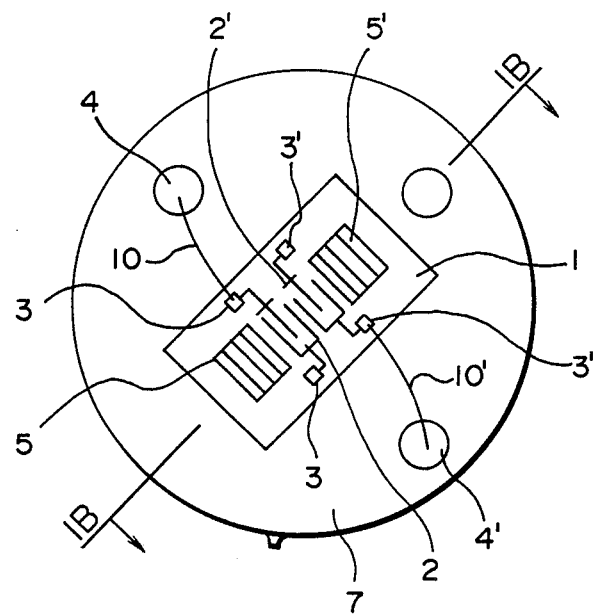
FIG. 1A is a plan view of a surface acoustic wave (SAW) resonator which is a typical example of the solid state electronic device in accordance with the present invention.
Figure 1B:
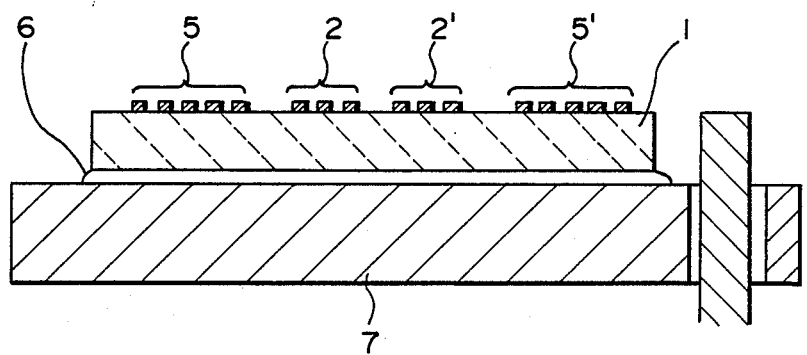
FIG. 1B is a sectional view taken on IB—IB line in FIG. 1A.

FIGS. 1A and 1B are view showing a typical embodiment of a solid state electronic device in accordance with the present invention. Specifically, FIG. 1A is a plan view of a two-port SAW resonator, and FIG. 1B is a sectional view taken on line IB—IB in FIG. 1A.

In FIGS. 1A and 1B, 1 is a SAW substrate made of ST-cut quartz. Provided on the surface of the SAW substrate are a pair of interdigital transducer electrodes (hereinafter referred to as IDT electrodes) 2 and 2′ for transmitting and receiving SAW. The IDT electrodes 2 and 2′ are set to have an aperture of 1000 μm. Each of the IDT electrodes 2 and 2′ has 28 electrode fingers. The IDT electrodes 2 and 2′ are connected with bonding pads 3 and 3′, respectively. The bonding pads 3 and 3′ are electrically connected with I/O pins 4 and 4′ of a can package system through bonding wires 10 and 10′, respectively. The bonding wires 10 and 10′ are made of an Al or Au (gold) wire having a diameter of 25 μm. Provided on both sides of a pair of the IDT electrodes 2 and 2′ are a pair of grating reflectors (hereinafter referred to as GR). Each of the GR's 5 and 5′ consists of 750 metallic strips.

The IDT electrodes 2, 2′ and the GR's 5, 5′ are patterns a thin film having a thickness of 0.1 μm formed using an Al alloy doped with Li of 0.1 wt %. This thin film is deposited on the SAW substrate 1 through the D.C. magnetron sputtering technique. After the deposition, the IDT electrodes 2, 2′ and GR's 5, 5′ are formed into respective predetermined patterns. Incidentally, the SAW substrate 1 is bonded to a can package system 7 in a TO-5- form by means of conductive bonding agent 6. The SAW resonator thus formed in accordance with this embodiment has characteristics of a resonant frequency of 697 MHz and loaded Q ≃ 4000 in a 50Ω measuring system.

Figure 2:
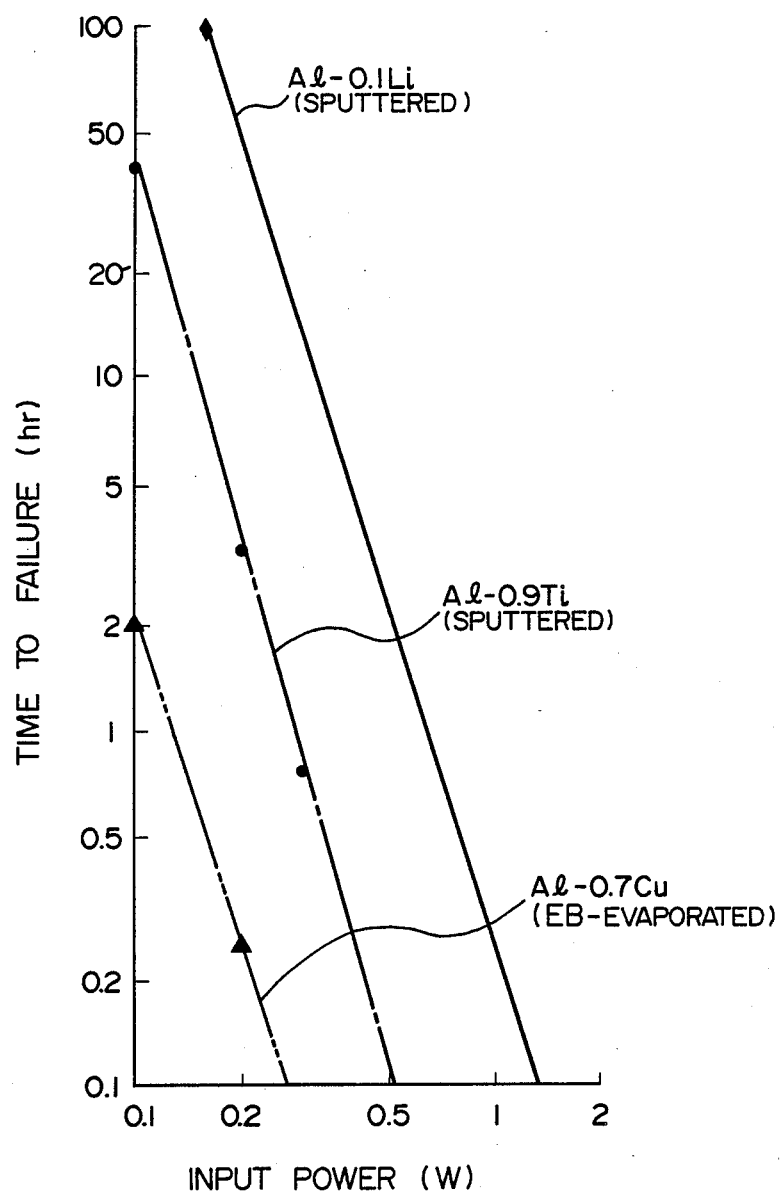
FIG. 2 is a graph showing the relation between an input power and time to failure.

FIG. 2 is a graph showing the relation between an input power applied to the SAW resonator and time to failure (TF).

In FIG. 2, a solid line indicates the characteristic of the SAW resonator of the embodiment shown in FIG. 1. A one-dot chain line indicates the characteristic of the SAW resonator in which the thin films (IDT electrodes, GR's) are made of an Al alloy containing Ti (titanium) by 0.9 wt % through the DC magnetron sputtering technique. A two-dot chain line indicates the characteristic of the SAW resonator in which the thin films are made of an Al alloy containing Cu (copper) by 0.7 wt % through the EB (electron beam) deposition technique. The condition for a failure test is an ambient temperature of 120° C. and an input power of 0.1–0.8 W. The time to failure TF is represented by the time when the resonant frequency has changed by 50 kHz from that at the test starting time.

As seen from FIG. 1, the SAW resonator in accordance with this embodiment can withstand or endure an input electric power which is about 2.5 times as large as the SAW resonator using the thin films added with Ti and also about 5 times as large as the SAW resonator using the thin films containing Cu.

Figure 3:
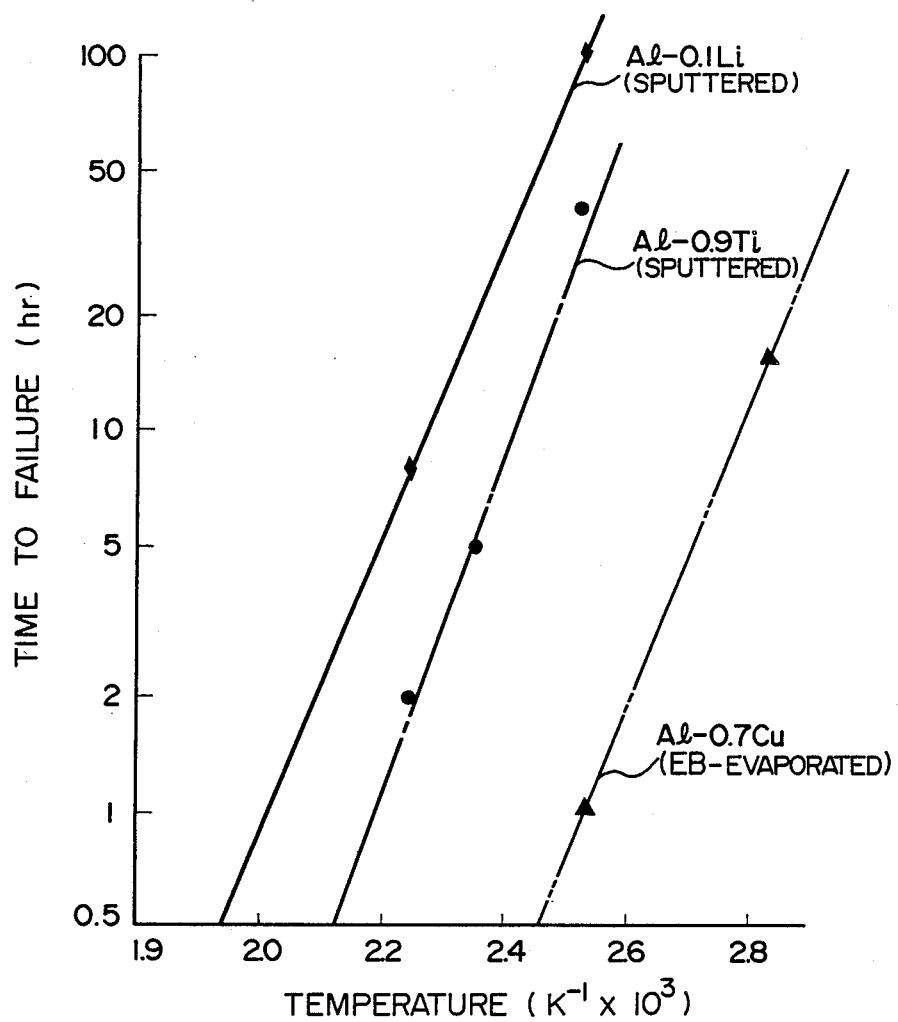
FIG. 3 is a graph showing the relation between a temperature and time to failure.

FIG. 3 is a graph showing the relation between a temperature and the time to failure. FIG. 3 substantially corresponds to FIG. 2. As seen from FIG. 3, the thin film of a Li-added Al alloy has a linear characteristic of a smaller gradient and is less influenced by the ambient temperature as compared with the Cu-added Al alloy thin film.

Figure 4:
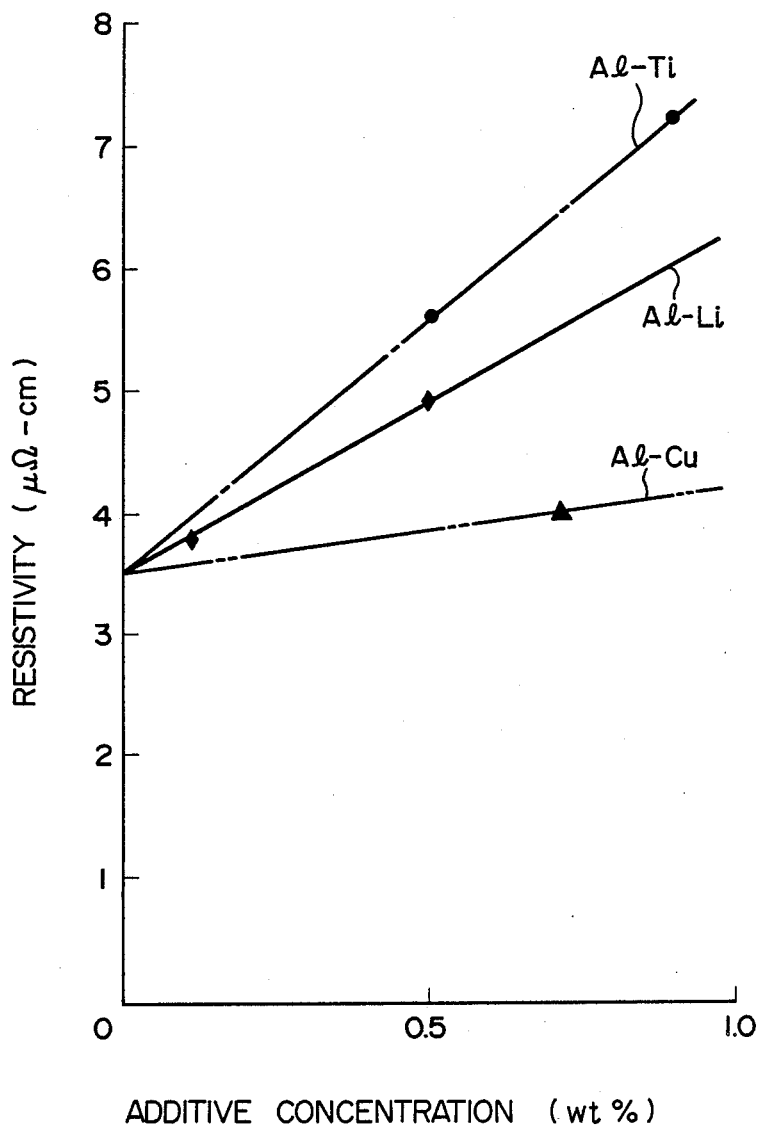
FIG. 4 is a graph showing the relation between an additive concentration and the resistivity of the thin film.

FIG. 4 is a graph showing the relation between the concentration (percentage) of additive and the resistivity of the Al alloy thin film. The resistivity can be measured through the four probe technique. In FIG. 4, a solid line indicates the characteristic of the Li-added Al alloy (Al-Li); a one-dot chain line indicates the characteristic of the Ti-added Al alloy (Al-Ti); and a two-dot chain line indicates the characteristic of the Cu-added Al alloy (Al-Cu). As seen from FIG. 4, the resistivity of the Al-Li thin film is 3.8 μΩ·cm with the percentage of the additive being 0.1 wt %. This value is smaller than the Al-Cu thin film added with Cu by 0.7 wt % although it is slight.

Figure 5:
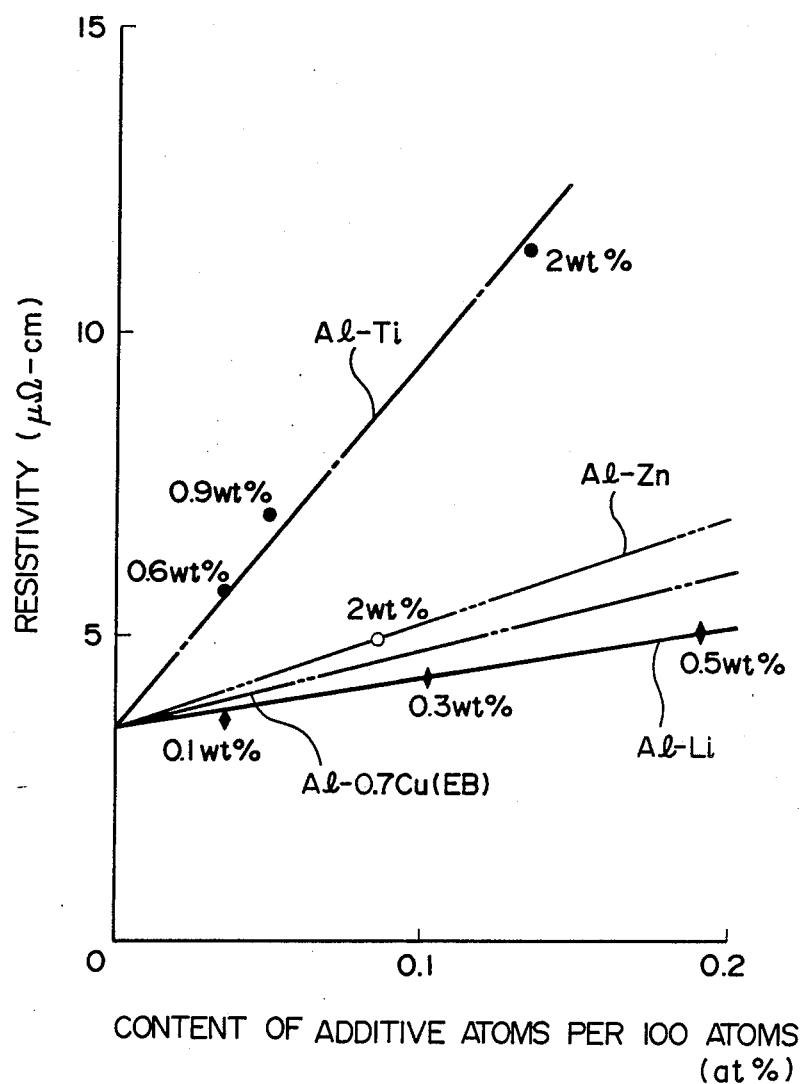
FIG. 5 is a graph showing the relation between the percentage (atomic %) of additive atoms in Al atoms and the resistivity of the thin film.

FIG. 5 is a graph showing the relation between the content (atomic %) of additive atoms per 100 atoms and the resistivity. In FIG. 5, a solid line indicates the characteristic of Al-Li; a one-dot chain line indicates that of Al-Ti; a two-dot chain line indicates that of Al-Cu; and a three-dot chain line indicates that of an Al alloy added with Zn (zinc) (Al-Zn). As seen from FIG. 5, the Li-Al thin film provides a lower resistivity with a smaller amount of additive than the Cu-Al thin film. Thus, the hardness of the Li-Al thin film is only slightly increased.

Figure 6:
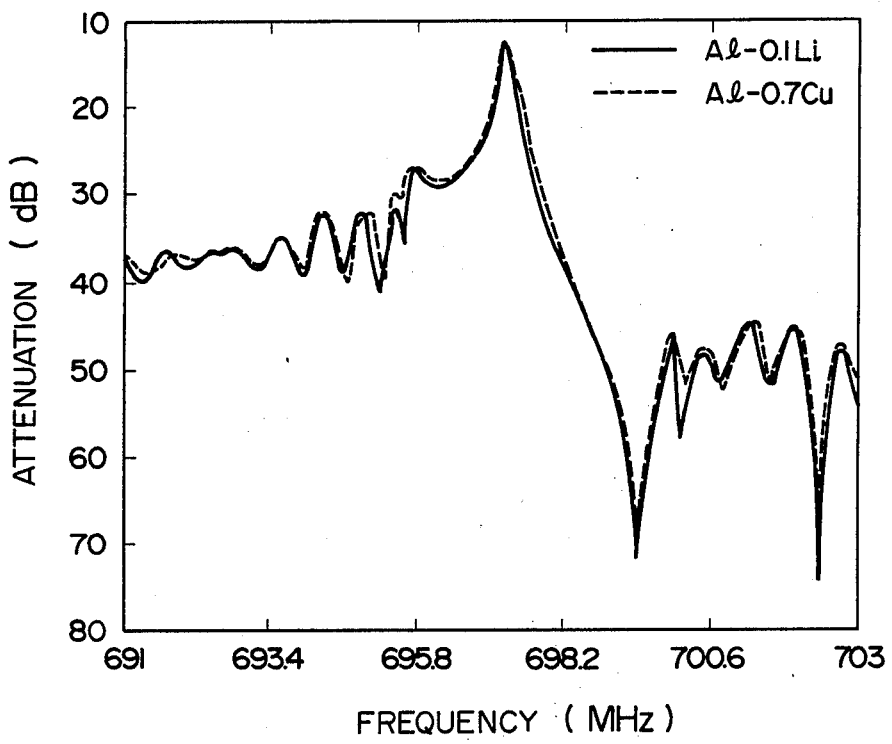
FIG. 6 is a graph showing a frequency characteristic in the case where the present invention is applied to a two-port SAW resonator.

FIG. 6 is a graph showing the frequency characteristics of the two-port SAW resonator of the present invention shown in FIG. 1 and of the conventional SAW resonator in which the thin films are made of an Al alloy containing Cu by 0.7 wt %. In FIG. 6, a solid line indicates the characteristic of this embodiment and a broken line indicates the characteristic of the conventional SAW resonator. The SAW resonator of this embodiment provides loss at a central frequency (697 MHz) which is improved by about 2 dB as compared with the conventional SAW resonator.

Figure 7:
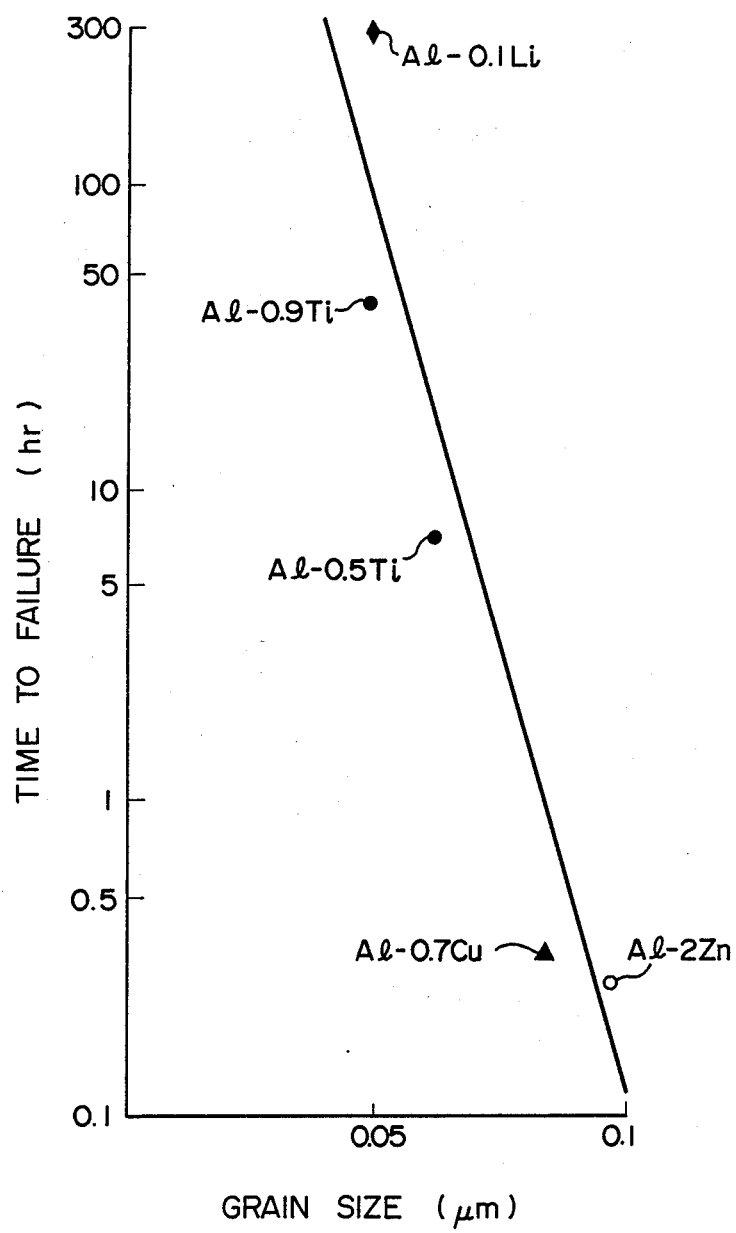
FIG. 7 is a graph showing the relation between a grain size and time to failure.

FIG. 7 is a graph showing the relation between the grain size (diameter) of the Al alloy thin film and the failure time. As seen from FIG. 7, the failure is extended as the size of the grains constituting the thin film is decreased. As a result of the failure test of the SAW resonator, it has been found out that the failure time of an Al film formed through the sputtering technique is one hour. On the basis of this result, the grain size in the Al-Li thin film is set to 0.05 μm or less in order to provide a power resistance characteristic 300 times as large as the pure Al film.

Figure 8:
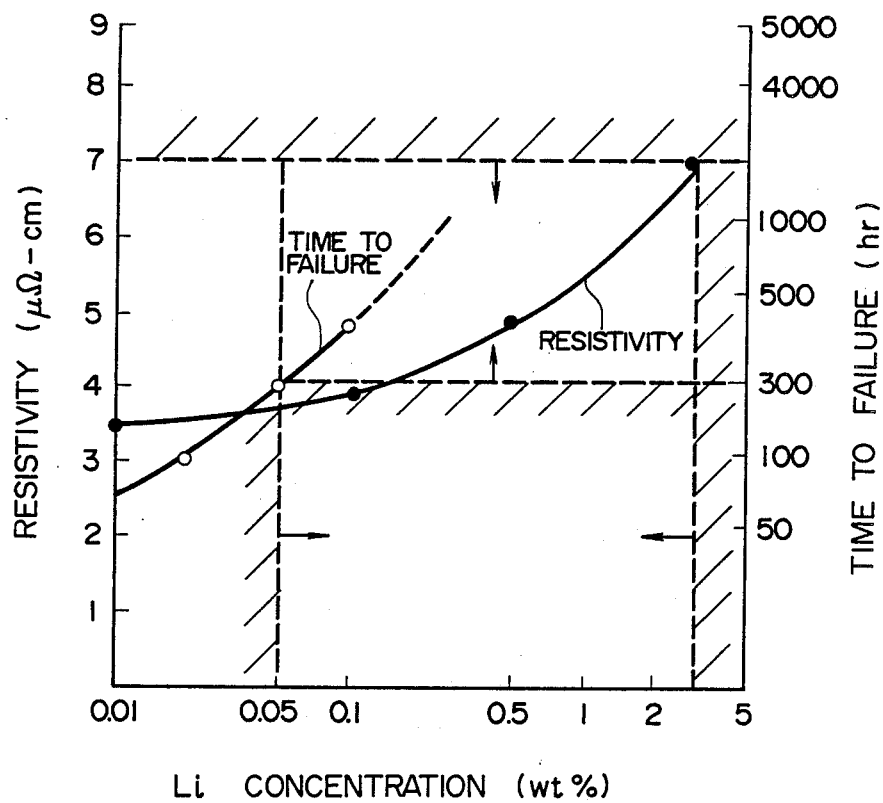
FIG. 8 is a graph showing the relations between Li concentration and the resistivity and between Li concentration and time to failure.

FIG. 8 is a graph showing the relations between the Li concentration and the resistivity and between the Li concentration and the failure time. In order to restrict the loss in the SAW resonator, the upper limit of the Al-Li thin film is set at a resistivity twice as large as pure aluminum, i.e. 7 μΩ·cm. And considering also the desired power handling capability (i.e. the failure time of 300 hours), the amount of Li to be added to Al is set at 0.05-3 wt %.

Figure 9:
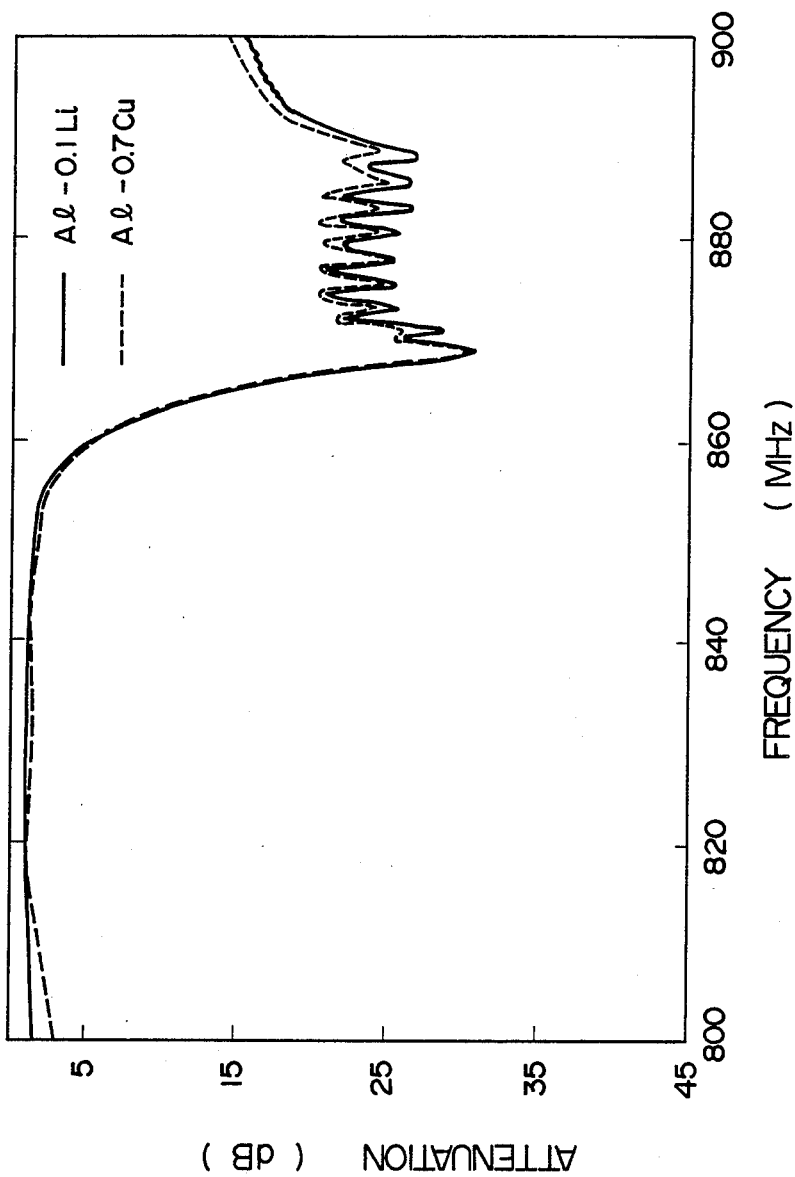
FIG. 9 is a graph showing the frequency characteristic in the case where the present invention is applied to the first stage filter on the transmission side of a cellular radio duplexer.

FIG. 9 is a graph showing the frequency characteristic in the case where the present invention is applied to the first stage filter (SAW filter) on the transmission side of a cellular radio duplexer.

Now, the SAW filter in accordance with this embodiment will be explained briefly. Used as a substrate for the SAW filter is LiTaO$_3$ which is a piezoelectric material cut with the crystal 36° rotated around the Y-axis thereof. SAW propagates in the X-axis direction of LiTaO$_3$. The electrode arrangement consists of 9 (nine) stage IDT electrodes (one port) with different resonant frequencies connected in series with each other. This arrangement provides a desired frequency band with the resonant frequencies being different. The radiation conductance and the susceptance exhibit large values in the neighborhood of the resonant frequency. Energy propagates among adjacent electrode fingers with different polarities by means of SAW and capacitance coupling. On the other hand, a cut-off state is produced at the antiresonant frequency on the high frequency band side. Thus, the frequency characteristic exhibits the passband and blocking band. Two such IDT electrode arrangements are provided on opposite end portions of the LiTaO$_3$ substrate. A shield electrode is provided intermediately between those IDT electrode arrangements. The IDT electrodes and input (output) pins are connected by bonding wires. Thus, the shield electrode and the wire connection prevent attenuation of the suppressing degree in the blocking band. The aperture of each of the IDT electrode arrangements consists of 10 (ten) wavelengths, and the number of the pairs of the IDT electrode fingers is 400.

In FIG. 9, the central frequency of the SAW filter is 835 MHz. As seen from FIG. 9, the Al-Li thin film provides loss of 1.0 dB at the central frequency of 835 MHz which is improved by 0.2 dB as compared with the conventional Al-Cu thin film. Also, with respect to the suppression degree at the frequency of 890 MHz in the blocking band, the Al-Li thin film provides the suppression degree improved by about 4 dB. The failure test of such as SAW filter was carried out under the condition of the ambient temperature of 100° C. and the output electric power of 4 W. As a result, the Al-Li thin film exhibited a power handling capability which is 50 times as large as the Al-Cu thin film.

The embodiments of the present invention have been explained in relation to the two-port SAW resonator using grating reflectors of metal strips and the SAW filter for a cellular radio duplexer which propagates a large electric power from an input electrode to an output electrode. However, the present invention should not be limited to these applications. For example, the present invention can be usefully applied to one-port SAW resonator and also the other SAW devices for a high frequency (or apparatuses using the SAW device). Further, the piezoelectric substrate used in this embodiment is made of LiTaO$_3$ which is cut along the 36° rotated Y axis and in which SAW propagates in the X axis direction. However, a substrate of the other material, e.g. LiN$_6$O$_3$ with a cut angle may be employed.

In the above embodiments, an artificial surface wave and SSBW (single side band wave) are used as a surface wave, but vibrations such as a Rayleigh wave, bulk wave, etc. may be used.

Moreover, the present invention can be usefully applied to several SAW filters to which a large electric power is to be supplied. Also the present invention can be usefully applied to the SAW resonator with a small electric power supplied but with a SAW having a large amplitude.

Furthermore, the present invention can be usefully applied to several systems using a SAW resonator or SAW filter. For example, the present invention can be applied to a cellular radio system, video tape recorder (VTR), automobile telephone, pocket bell, converter for CATV, and a SS (Spread Spectrum) communication system using a convolver bulk vibration device.

Although the Al-Li thin film employed in the above embodiment has been in the form of a single layer, it may be constructed in the form of a multi-layer. For example, a plurality of films in the multi-layer structure constructed using an Al-Li alloy and a pure Al (or Al-alloy added with the other additive) may be employed. This multi-layer film provides a lower resistivity, which further improves the power handling capability of the SAW device. Further, using a ternary alloy consisting of the Al-Li alloy plus one of magnesium (Mg) also improves the power handling capability. The use of Mg, Ti or Cu, which is excellent in its creeping resistance property and migration resistance property, can relax the internal stress of the thin film.

Incidentally, it has been confirmed that the Al-Li alloy thin film formed through the DC magnetron sputtering technique provides, for the same life, the power handling capability about 1.2 times as large as that formed through the EB deposition technique (the DC magnetron sputtering is also advantageous in controlling the film growth).

We claim:

1. A solid state electronic device comprising:
    a substrate along which a surface acoustic wave propagates, and
    a conductive thin film provided on the surface of said substrate, said conductive thin film constituting at least one of electrodes, electric wiring patterns and bonding pads, wherein at least a part of said conductive thin film is made of a first aluminum alloy added with lithium by 0.05-3 wt %.

2. A solid state electronic device according to claim 1, wherein first aluminum alloy has a grain size set to 0.05 μm or less.

3. A solid state electronic device according to claim 1, wherein said conductive thin film consists of a first thin film of said Al alloy and a second thin film of pure aluminum, which are laminated in a multi-layer structure.

4. A solid state electronic device according to claim 2, wherein said conductive thin film consists of a first thin film of said Al alloy and a second thin film of pure aluminum, which are laminated in a multi-layer structure.

5. A solid state electronic device according to claim 1, wherein said conductive thin film consists of a first thin film of said Al alloy and a third thin film of a second Al alloy, which are laminated in a multi-layer structure.

6. A solid state electronic device according to claim 2, wherein said conductive thin film consists of a first thin film of said Al alloy and a third thin film of a second Al alloy, which are laminated in a multi-layer structure.

7. A solid state electronic device according to claim 1, wherein said substrate is made of ST-cut quartz, and said electrodes include a set of interdigital electrodes and a pair of grating reflectors provided on both sides of said interdigital electrodes, each grating reflector consisting of a plurality of metal strips.

8. A solid state electronic device according to claim 1, wherein said substrate is made of $LiTaO_3$ cut the crystal 36° rotated around the Y-axis thereof, and said electrodes include a set of electrodes consisting of a plurality of interdigital electrodes with different resonant frequencies connected in series and a shield electrode provided intermediately between said set of electrodes.

* * * * *